(12) United States Patent
    Moore

(10) Patent No.: US 9,070,286 B2
(45) Date of Patent: Jun. 30, 2015

(54) TRAFFIC-MONITORING SMART TAPE

(71) Applicant: XEROX CORPORATION, Norwalk, CT (US)

(72) Inventor: Steven R. Moore, Pittsford, NY (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 14/073,004

(22) Filed: Nov. 6, 2013

(65) Prior Publication Data

US 2015/0124924 A1    May 7, 2015

(51) Int. Cl.
    *G08G 1/01*    (2006.01)
(52) U.S. Cl.
    CPC ........................... *G08G 1/01* (2013.01)
(58) Field of Classification Search
    CPC ............. B22F 2998/00; B22F 2998/10; B22F 1/0088; H01L 2924/00
    See application file for complete search history.

(56) References Cited

U.S. PATENT DOCUMENTS

| 2008/0169384 A1* | 7/2008 | Adams et al. ............... 244/76 R |
| 2012/0128115 A1* | 5/2012 | Milon et al. ...................... 377/9 |
| 2014/0002258 A1* | 1/2014 | Chen ............................ 340/447 |

\* cited by examiner

*Primary Examiner* — Sibin Chen
(74) *Attorney, Agent, or Firm* — MH2 Technology Law Group LLP

(57) ABSTRACT

The present invention generally relates to techniques for traffic monitoring. The techniques utilize a relatively low cost sensing system, referred to here as "smart tape." Smart tape is adhered directly to the roadway and provides the ability to temporarily monitor traffic. It can be applied in an appropriate length for the roadway condition. Smart tape is responsive to the pressure of a vehicle's tires passing over it. Furthermore, smart tape does not require an attached monitoring device, unlike certain known traffic monitoring techniques.

16 Claims, 3 Drawing Sheets

TRAFFIC-MONITORING SMART TAPE

FIELD OF THE INVENTION

This invention relates generally to techniques for monitoring traffic parameters.

SUMMARY

According to various embodiments, a device is presented. The device includes a plurality of segments of a laminated structure separable from each other, each segment including: at least one pressure sensor, an energy source, and a microcontroller operably coupled to the at least one pressure sensor and the energy source.

Various optional features of the above embodiment include the following. Each microcontroller can be configured to communicate wirelessly with a controller device. The device can be accompanied by at least one non-transitory computer readable medium comprising instructions which, when executed by at least one electronic processor of a controller device, configure the at least one processor to communicate with the plurality of segments. The instructions, when executed by the at least one electronic processor of the controller device, can further configure the at least one processor to compute at least one of a number of vehicles that have passed over a portion of the plurality of segments and times that each of a plurality of vehicles have passed over a portion of the plurality of segments. The instructions, when executed by the at least one electronic processor of the controller device, can further configure the at least one processor to compute speeds of each of a plurality of vehicles that have passed over a portion of the plurality of segments. The instructions, when executed by the at least one electronic processor of the controller device, can further configure the at least one processor to synchronize internal clocks of each microcontroller of the plurality of segments. The at least one pressure sensor can include a piezoelectric element. Each segment can be configured to harvest energy from a piezoelectric element. The energy source of each segment can include at least one battery. The plurality of segments can be separable from each other by perforations.

According to various embodiments, a method is presented. The method includes adhering a section of smart tape on a road, where the section of smart tape includes a plurality of segments of a laminated structure separable from each other, each segment including: at least one pressure sensor, an energy source, and a microcontroller operably coupled to the at least one pressure sensor and the energy source. The method also includes electronically communicating with each of the microcontrollers using a controller device.

Various optional features of the above embodiment include the following. The communicating can include wirelessly communicating. The controller device can include at least one of: a smart phone and a computer. The method can include computing, by the controller device, at least one of a number of vehicles that have passed over a portion of the plurality of segments and times that each a plurality of vehicles have passed over a portion of the plurality of segments. The method can further include computing, by the controller device, speeds of each of a plurality of vehicles that have passed over a portion of the plurality of segments. The method can further include synchronizing internal clocks of each microcontroller of the plurality of segments. The at least one pressure sensor can include a piezoelectric element. The energy source of each segment can include at least one battery. The plurality of segments can be separable from each other by perforations.

BRIEF DESCRIPTION OF THE DRAWINGS

Various features of the embodiments can be more fully appreciated, as the same become better understood with reference to the following detailed description of the embodiments when considered in connection with the accompanying figures, in which.

DESCRIPTION OF THE EMBODIMENTS

Figure 1:
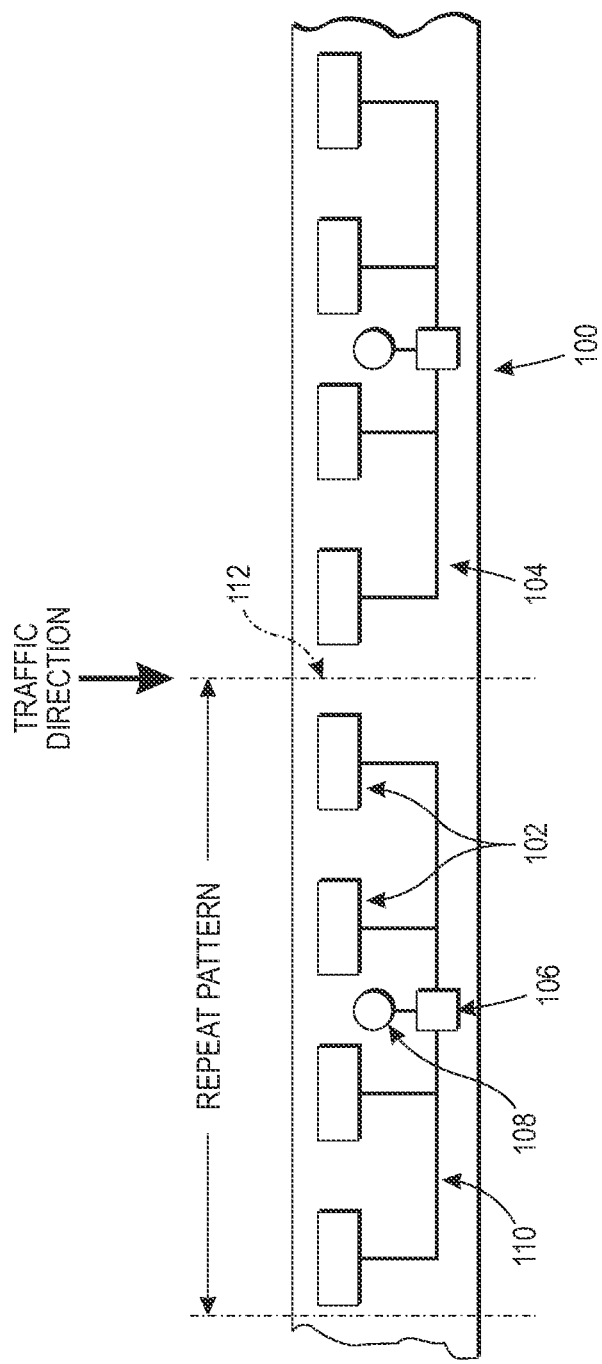
FIG. 1 is a schematic diagram depicting a top view of an embodiment.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Traffic planners require knowledge of traffic parameters such as vehicles per hour, average speed, vehicle spacing, etc. on roads. This information can be useful in developing traffic signal patterns, speed limits, placement of stop and yield signs, and roadway improvements. A common technique for determining traffic parameters involves placing one or more pneumatic tubes across a road to sample traffic flow. Each tube is connected to a meter, which senses and logs the air pressure spikes that occur as a vehicle passes over the tube. Such sensors are typically deployed temporarily by municipal or regional planners in order to collect data on traffic patterns. The data may be used to inform various decisions, e.g., to alter intersection signaling or signs, or to evaluate whether roadway improvements are needed. Shortcomings of this approach include the need for an adjacent monitoring device, which is prone to damage or tampering, and the inability to distinguish where along the length of the tube is the vehicle crossing.

An alternate known sensing technology uses cameras or vision systems to count passing vehicles. Captured data is analyzed in order to identify and count vehicles. Shortcomings of such techniques include the need for a secure and tamper-proof mounting location that affords a good view of traffic, lack of robustness across different lighting and weather conditions, and potential privacy concerns.

Embodiments of the present invention provide an improved technique for gathering traffic parameters. Some embodiments include what is referred to herein as "smart tape", which provides a superset of the capabilities of pneumatic tube sensors. According to some embodiments, smart tape is adhesively applied to a roadway in order to provide a temporary traffic sampling function. The smart tape can be essentially cut to length. Embedded within the smart tape are a multiplicity of piezoelectric pressure sensors and microcontrollers. In operation, the pressure spikes are logged by the microcontrollers in the smart tape as vehicles compress the sensors. By orienting the tape at a non-normal angle to traffic direction, an estimate of vehicle speed can also be recorded. The logged data can be periodically collected by a mobile device that links wirelessly with each microcontroller.

FIG. 1 is a schematic diagram depicting a top view of an embodiment. Smart tape 100 includes sections separated from each other by perforations 112. Smart tape 100 can be separated along perforations 112 to separate sections.

Each section includes a series of piezoelectric sensors 102 bonded to tape substrate 104. FIG. 1 depicts four piezoelectric sensors 102 per section, but other embodiments can utilize a different number. Piezoelectric sensors 102 can be made of polyvinylidene fluoride film (trade name KYNAR, available from Arkema, Inc. of King of Prussia, Pa.), which has well known piezoelectric properties. Typical tire (contact) pressure is 25-35 psi, so piezoelectric sensors that trigger with such pressure are generally sufficient.

Each section also includes microcontroller 106 and electrically-connected battery 108. A suitable family of microcontrollers is MSP430Gxxxx, available from Texas Instruments of Dallas, Tex. Suitable members of that family include 0.5 KB SRAM, 16 KB flash, two 16-bit timers, 8 ADC channels, and a wireless function (e.g., BLUETOOTH and/or WIFI). Piezoelectric sensors 102 for each section are electrically connected to the analog-to-digital inputs of the respective microcontroller 106 for that section by way of electrical traces 110.

Smart tape 100 thus has a repeat pattern and can be cut or torn to length accordingly. As shown in FIG. 1, the repeat interval can be about two feet. A typical lane width is about 10-12 feet. Typical vehicle tire widths are in the 175 to 265 mm range (7-10.5 in), so placing piezoelectric sensors 102 every six inches can capture the passage of any vehicle.

Figure 2:
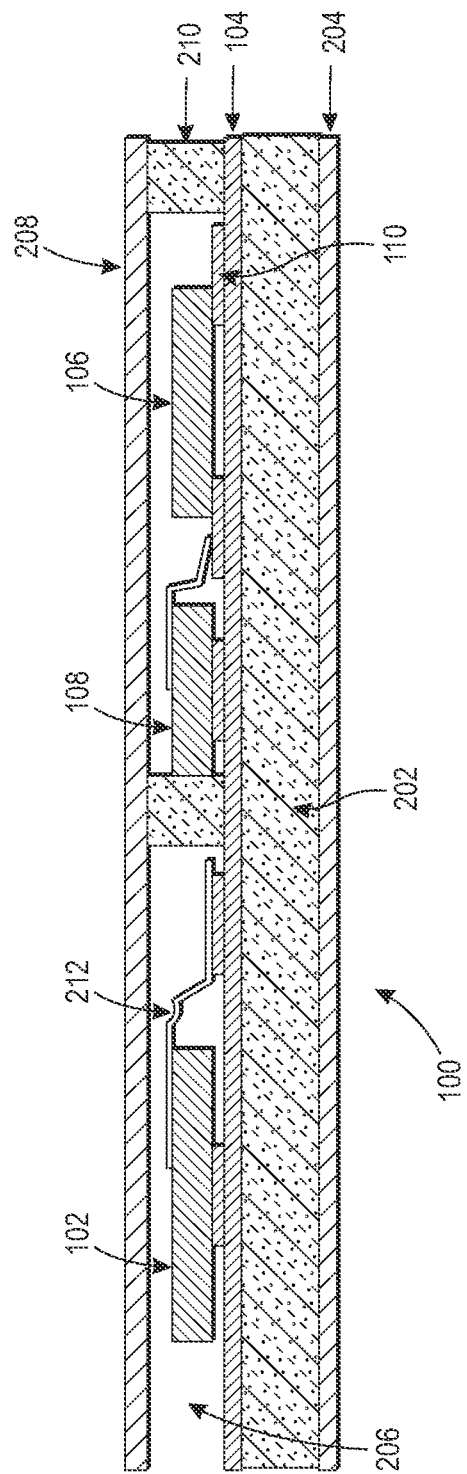
FIG. 2 is a schematic diagram depicting a cross-sectional view of an embodiment.

FIG. 2 is a schematic diagram depicting a cross-sectional view of the laminated structure of an embodiment 100. The base structure of smart tape 100 is film substrate 202. In some embodiments, film substrate 104 is made of a material such as polyethylene terephthalate or polyimide (tradename KAPTON, available from Argon of Monrovia, Calif.). Substrate 104 is laminated to pressure-sensitive adhesive layer 202 on the bottom side of smart tape 100. Removable release liner 204 (e.g., treated paper) is laminated to adhesive layer 202. Conductive traces 110 are patterned onto the top side of substrate 104. Traces 110 can be, e.g., photo-etched, printed, or deposited, and made of copper or silver. Piezoelectric sensors 102, batteries 108, microcontrollers 106, and conductive foil connectors 212 are assembled onto substrate 104 such that they contact conductive traces 110 at appropriate locations. Batteries 108 may be off-the-shelf watch style disc or button batteries. Further, strain relievers 210 can be interposed among the various elements in order to partially protect electronics, such as microcontrollers 106. Any voids remaining after the elements have been assembled can be filled with flexible encapsulant 206. Top liner 208 can be constructed from the same or different material as that of substrate 104.

Figure 3:
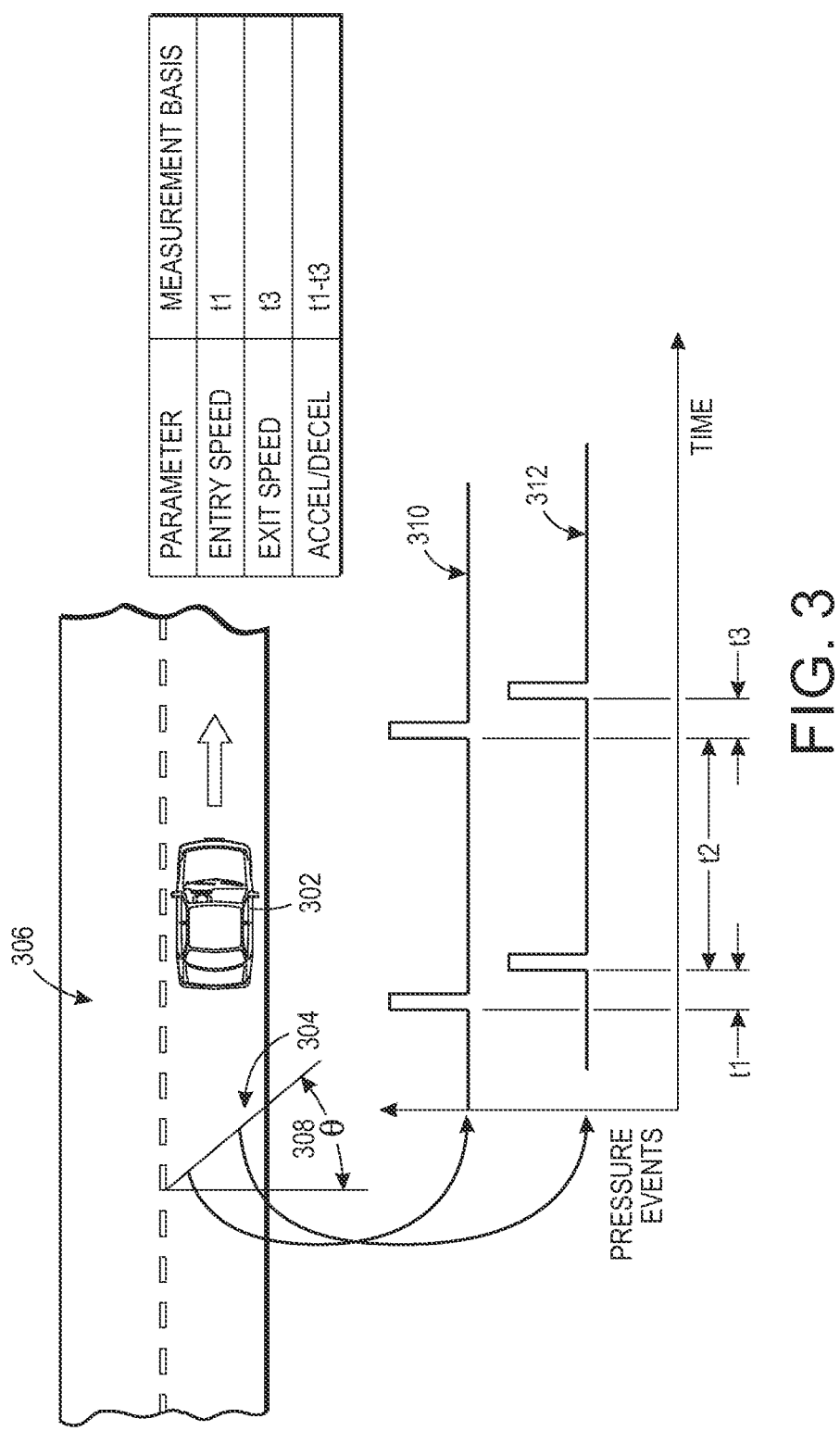
FIG. 3 is a schematic diagram depicting an embodiment in use.

FIG. 3 is a schematic diagram depicting an embodiment in use. Thus, FIG. 3 depicts the location of an embodiment 304 as adhered to road 306 at an angle of θ 308 to the perpendicular to road 306. Car 302 passing over the embodiment at position 304 triggers transient pressure events 310, 312 as detected by the pressure sensors of the embodiment. More particularly, because the embodiment is positioned at an angle to the road, each pair of tires on an axle on car 302 is incident on the smart tape at a different time. As depicted in FIG. 3, transient pressure events 310 from the tire on the driver's side of car 302 occur first, then transient pressure events 312 from the tire on the passenger side.

Each microcontroller has internal memory in which pressure transient events can be stored. Depending on the desired operating mode, discussed further below, pressure transient events can be merely counted, they can be timestamped, or both. Also possible are more advanced measurements, such as vehicle speed and acceleration. Such measurements might be useful, for instance, adjacent to a secondary road intersection controlled by a stop sign, in order to estimate driver compliance. Note that from the perspective of each microcontroller, pressure transient events are being timestamped and logged locally; further off-line post-processing can be used to calculate speeds and accelerations. Pressure transient events can be timestamped according to, e.g., the leading or trailing edge of the event. FIG. 3 depicts using leading edges.

Example calculations of traffic parameters are discussed presently. For number of cars, a simple tally of pressure events can be scaled to account for multiple axles and wheels. That is, pairs of closely-spaced pressure events indicate wheels on the same axle, and small temporal separations between such pairs of events can indicate that the axles are on the same vehicle. For vehicle speed, the following calculation can be used.

$$v = \frac{h\sin\theta}{t1} \quad (1)$$

In Equation (1) above, the term v represents vehicle velocity (i.e., speed), the term h represents distance between wheels incident on the embodiment (that is, the distance between pressure events as measured along the smart tape itself, i.e., along the hypotenuse of the triangle shown in FIG. 3), the term t1 is as depicted in FIG. 3, and the term θ is as depicted in FIG. 3. The term "sin" is the trigonometric sine function. Using data from an embodiment positioned as shown in FIG. 3, the value of h can be calculated by determining which sensors detected the pressure event, and knowing how far apart the sensors are spaced. The term t1 is determined by noting times between pressure events as shown in the graph appearing in FIG. 3. (In some embodiments, the denominator of Equation (1) can be t3, or an average of t1 and t3.) The value of θ is determined by measurement of the placement of the smart tape. With these parameters, the velocity of each axle can be determined, and from that quantity and timing information, the value of v can be derived. The calculations discussed herein can be performed by a computer, smart phone, or other programmed device.

Each microcontroller has wireless communication capability. Accordingly, an operator can interact with an embodiment using a controller device equipped to communicate using the same wireless protocol. Suitable controller devices include, e.g., properly programmed laptop computers, properly programmed smart phones, and specialized devices configured to communicate with smart tape. These devices can be configured by installing software, e.g., an app. Various operations can be implemented. For example, because each segment of smart tape is essentially autonomous, a synchronizing command can be issued from the controller device to synchronize the internal clocks in each segment of the same installation of smart tape. Clock synchronization permits calculations such as that depicted in reference to Equation (1) in which separate segments can report temporally close events.

As another example, a controller device can issue operating commands, such as, by way of non-limiting example: clear tallies, initiate tallies, clear timestamps, reset all stored data, report data, etc. Further commands from the controller device can select between simple counts (tallies) and timestamps.

Smart tape is not necessarily intended to be a permanent data collection device. Smart tape is advantaged for supporting a flexible sampling plan of a significant number of roads. The cost of to set up and operate a smart tape system will in general be significantly less than that for other sensing technologies. For example, the microcontrollers, piezoelectric sensors, and batteries are each on the order of $1 or less. Smart tape can be considered a consumable measurement device. Failures due to dynamic loading, water intrusion, thermal cycling fatigue, etc. will be gradual rather than catastrophic, due to the segmented nature of the smart tape design. Further, sampling durations can be on the order of every few weeks or less, so the useful life requirement is not demanding.

Variations of embodiments are possible. For example, the design could be self-powered by harvesting the energy being output by each piezoelectric sensor as it is compressed. Vehicle weights and axle counts can be estimated given the distributed and proportional nature of the piezoelectric sensors. Other sensor types can also be embedded, such as infrared detectors to detect, for instance, a hot brake condition on a tractor trailer.

Certain embodiments described above can be performed in part using a computer application or program. The computer program can exist in a variety of forms, both active and inactive. For example, the computer program can exist as one or more software programs, software modules, or both, that can be comprised of program instructions in source code, object code, executable code or other formats, firmware program(s), or hardware description language (HDL) files. Any of the above can be embodied on a computer readable medium, which can include computer readable storage devices and media in compressed or uncompressed form. Exemplary computer readable storage devices and media include conventional computer system RAM (random access memory), ROM (read-only memory), EPROM (erasable, programmable ROM), EEPROM (electrically erasable, programmable ROM), and magnetic or optical disks or tapes.

While the invention has been described with reference to the exemplary embodiments thereof, those skilled in the art will be able to make various modifications to the described embodiments without departing from the true spirit and scope. The terms and descriptions used herein are set forth by way of illustration only and are not meant as limitations. In particular, although the method has been described by examples, the steps of the method can be performed in a different order than illustrated or simultaneously. Those skilled in the art will recognize that these and other variations are possible within the spirit and scope as defined in the following claims and their equivalents.

What is claimed is:

1. A device comprising:
   a plurality of segments of a laminated structure separable from each other by perforations, each segment comprising:
      at least one pressure sensor;
      an energy source;
      a microcontroller operably coupled to the at least one pressure sensor and the energy source; and
      at least one non-transitory computer readable medium comprising instructions which, when executed by at least one electronic processor of a controller device, configure the at least one processor to synchronize internal clocks of each microcontroller of the plurality of segments.

2. The device of claim 1, wherein each microcontroller is configured to communicate wirelessly with a controller device.

3. The device of claim 2, further comprising at least one non-transitory computer readable medium comprising instructions which, when executed by at least one electronic processor of a controller device, configure the at least one processor to communicate with the plurality of segments.

4. The device of claim 3, wherein the instructions, when executed by the at least one electronic processor of the controller device, further configure the at least one processor to compute at least one of a number of vehicles that have passed over a portion of the plurality of segments and times that each of a plurality of vehicles have passed over a portion of the plurality of segments.

5. The device of claim 3, wherein the instructions, when executed by the at least one electronic processor of the controller device, further configure the at least one processor to compute speeds of each of a plurality of vehicles that have passed over a portion of the plurality of segments.

6. The device of claim 1, wherein the at least one pressure sensor comprises a piezoelectric element.

7. The device of claim 1, wherein each segment is configured to harvest energy from a piezoelectric element.

8. The device of claim 1, wherein the energy source of each segment comprises at least one battery.

9. A method of traffic monitoring comprising:
   adhering a section of smart tape on a road, wherein the section of smart tape comprises a plurality of segments of a laminated structure separable from each other by perforations, each segment comprising:
      at least one pressure sensor;
      an energy source; and
      a microcontroller operably coupled to the at least one pressure sensor and the energy source;
   synchronizing internal clocks of each microcontroller of the plurality of segments; and
   electronically communicating with each of the microcontrollers using a controller device.

10. The method of claim 9, wherein the communicating comprises wirelessly communicating.

11. The method of claim 10, wherein the controller device comprises at least one of: a smart phone and a computer.

12. The method of claim 11, further comprising computing, by the controller device, at least one of a number of vehicles that have passed over a portion of the plurality of segments and times that each of a plurality of vehicles have passed over a portion of the plurality of segments.

13. The method of claim 11, further comprising computing, by the controller device, speeds of each of a plurality of vehicles that have passed over a portion of the plurality of segments.

14. The method of claim 9, wherein the at least one pressure sensor comprises a piezoelectric element.

15. The method of claim 9, wherein each segment is configured to harvest energy from a piezoelectric element.

16. The method of claim 9, wherein the energy source of each segment comprises at least one battery.

* * * * *